United States Patent
Yamamoto et al.

(10) Patent No.: US 11,303,206 B2
(45) Date of Patent: Apr. 12, 2022

(54) SEMICONDUCTOR DEVICE AND LOAD CONTROL SYSTEM

(71) Applicant: Rohm Co., Ltd., Kyoto (JP)

(72) Inventors: Natsuki Yamamoto, Kyoto (JP); Satoru Nate, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 142 days.

(21) Appl. No.: 16/707,948

(22) Filed: Dec. 9, 2019

(65) Prior Publication Data
US 2020/0186031 A1 Jun. 11, 2020

(30) Foreign Application Priority Data

Dec. 11, 2018 (JP) ............................. JP2018-231894

(51) Int. Cl.
*H02M 3/156* (2006.01)
*H02M 3/335* (2006.01)
*H03K 17/691* (2006.01)
*H03K 17/60* (2006.01)

(52) U.S. Cl.
CPC ....... *H02M 3/156* (2013.01); *H02M 3/33523* (2013.01); *H02M 3/33576* (2013.01); *H03K 17/601* (2013.01); *H03K 17/691* (2013.01)

(58) Field of Classification Search
CPC ............ H02M 3/156; H02M 3/33523; H02M 3/33576; H03K 17/601; H03K 17/691
USPC .......................................................... 363/84
See application file for complete search history.

(56) References Cited

U.S. PATENT DOCUMENTS

| | | | |
|---|---|---|---|
| 10,693,384 B1* | 6/2020 | Mondal | H02M 3/33592 |
| 2011/0305043 A1* | 12/2011 | Matsumoto | H02M 3/33592 363/21.01 |
| 2013/0027983 A1* | 1/2013 | Nate | H02M 3/335 363/21.01 |
| 2014/0313792 A1* | 10/2014 | Nate | H02M 3/33523 363/21.15 |
| 2016/0218625 A1* | 7/2016 | Chen | H02M 1/00 |

FOREIGN PATENT DOCUMENTS

JP 2008-178241 7/2008

\* cited by examiner

*Primary Examiner* — Tomi Skibinski
(74) *Attorney, Agent, or Firm* — Fish & Richardson P.C.

(57) ABSTRACT

A semiconductor device disposed on a primary side of a system generating a secondary side voltage in an insulated form from a primary side voltage includes: a signal generation circuit configured to generate a voltage information signal for transmitting voltage information based on the primary side voltage to a secondary side of the system in the insulated form.

12 Claims, 13 Drawing Sheets

FIG. 6A
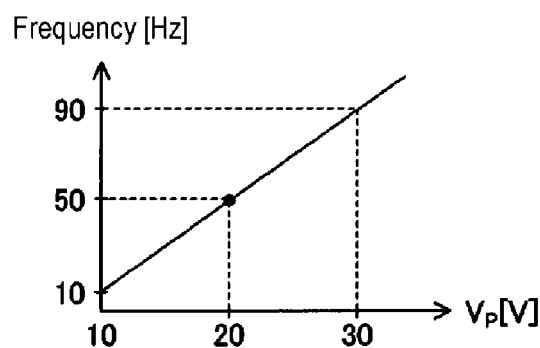
FIG. 6B

SEMICONDUCTOR DEVICE AND LOAD CONTROL SYSTEM

CROSS-REFERENCE TO RELATED APPLICATION

This application is based upon and claims the benefit of priority from Japanese Patent Application No. 2018-231894, filed on Dec. 11, 2018, the entire contents of which are incorporated herein by reference.

TECHNICAL FIELD

The present disclosure relates to a semiconductor device and a load control system.

BACKGROUND

FIG. 15 shows an overall configuration of a load driving device 900 in the related art. In the load driving device 900, a DC voltage $V_{DC}$ is generated by diode-rectifying an AC voltage such as a commercial AC voltage. Then, a load 901 such as a motor is driven under control of a load control circuit 902 by applying the DC voltage $V_{DC}$ to the load 901. Although the magnitude of the DC voltage $V_{DC}$ increases or decreases according to the increase or decrease of an input AC voltage to the load driving device 900, it is often necessary to change the control of the load 901 according to the magnitude of the DC voltage $V_{DC}$. For example, the effective value of the AC voltage may be 100V or 200V depending on a region where the load driving device 900 is used, but there are many cases where various changes in relation to the control of the load 901 are required depending on whether an effective value of the AC voltage is 100V or 200V.

Thus, in the load driving device 900, voltage information indicating the magnitude of the DC voltage $V_{DC}$ is given to the load control circuit 902, and control of the load 901 (for example, control of the number of rotations of a motor) is performed according to the voltage information.

On the other hand, as in a load driving device 910 shown in FIG. 16, it is also common to separate a primary side and a secondary side using a transformer and drive a load 911 on the secondary side.

In the configuration of FIG. 16, the drive voltage of the load 911 is a secondary side voltage V2, but the secondary side voltage V2 increases or decreases as an input AC voltage and a primary side voltage V1 increase or decrease. Even in such a configuration, it is beneficial if information on the primary side voltage V1, which has undergone diode rectification, can be utilized in controlling the load 911, and development of a device that makes it possible to implement the same is needed.

SUMMARY

Some embodiments of the present disclosure provide a semiconductor device and a load control system that contribute to information transmission of a primary side voltage.

According to an embodiment of the present disclosure, there is provided a semiconductor device disposed on a primary side of a system which generates a secondary side voltage in an insulated form from a primary side voltage. The semiconductor device includes: a signal generation circuit configured to generate a voltage information signal for transmitting voltage information based on the primary side voltage to a secondary side of the system in the insulated form.

In some embodiments, the signal generation circuit may be further configured to generate the voltage information signal based on an input voltage obtained by dividing the primary side voltage.

In some embodiments, the signal generation circuit may include a plurality of comparators configured to compare the input voltage with a plurality of reference voltages, and the signal generation circuit may be further configured to generate the voltage information signal according to a result of the comparison of each of the comparators.

In some embodiments, wherein the signal generation circuit may include a current generation circuit configured to generate a current corresponding to the input voltage, and wherein the signal generation circuit may be further configured to generate a signal corresponding to a magnitude of the current as the voltage information signal.

In some embodiments, the semiconductor device may further include a voltage dividing resistor configured to divide the primary side voltage to obtain the input voltage, wherein the voltage dividing resistor and the signal generation circuit may be integrated on a single semiconductor substrate.

In some embodiments, a high breakdown voltage region and other regions may be formed on the semiconductor substrate, a breakdown voltage in a substrate thickness direction may be higher in the high breakdown voltage region than in the other regions, and the voltage dividing resistor may be formed in the high breakdown voltage region.

In some embodiments, the high breakdown voltage region may be an LDMOSFET region.

In some embodiments, a plurality of drain regions each having a ring shape and a plurality of source regions each having a ring shape may be alternately and concentrically formed in the LDMOSFET region, and the voltage dividing resistor may be formed on a field oxide film surrounded by an innermost peripheral drain region among the plurality of drain regions.

In some embodiments, the semiconductor device may further include a plurality of external terminals configured to protrude from a housing in which the semiconductor substrate is accommodated, the plurality of external terminals may include a first external terminal configured to receive the primary side voltage and a plurality of second external terminals different from the first external terminal, and a distance between the first external terminal and a second external terminal adjacent to the first external terminal among the plurality of second external terminals may be larger than a distance between two second external terminals adjacent to each other among the plurality of second external terminals.

In some embodiments, the semiconductor device may further include a plurality of external terminals configured to protrude from a housing in which the semiconductor substrate is accommodated, the plurality of external terminals may include a first external terminal configured to receive the primary side voltage and a plurality of second external terminals different from the first external terminal, and the first external terminal may be disposed at an end of the housing In some embodiments, wherein the signal generation circuit may be further configured to generate a signal that is pulse width-modulated or a signal that is pulse frequency-modulated according to the primary side voltage, as the voltage information signal.

In some embodiments, the voltage information may be transmitted to the secondary side using a photo coupler or a transformer.

According to another embodiment of the present disclosure, there is provided a load control system. The system includes: the semiconductor device; and a load control circuit disposed on the secondary side, the load control circuit being configured to control a load to be driven based on the secondary side voltage, wherein the load control circuit is configured to control the load based on the voltage information transmitted from the semiconductor device.

BRIEF DESCRIPTION OF DRAWINGS

FIGS. 6A and 6B are views showing a relationship between the primary side voltage and a frequency of a voltage information signal generated as a PFM signal according to the first embodiment of the present disclosure.

DETAILED DESCRIPTION

Figure 1:
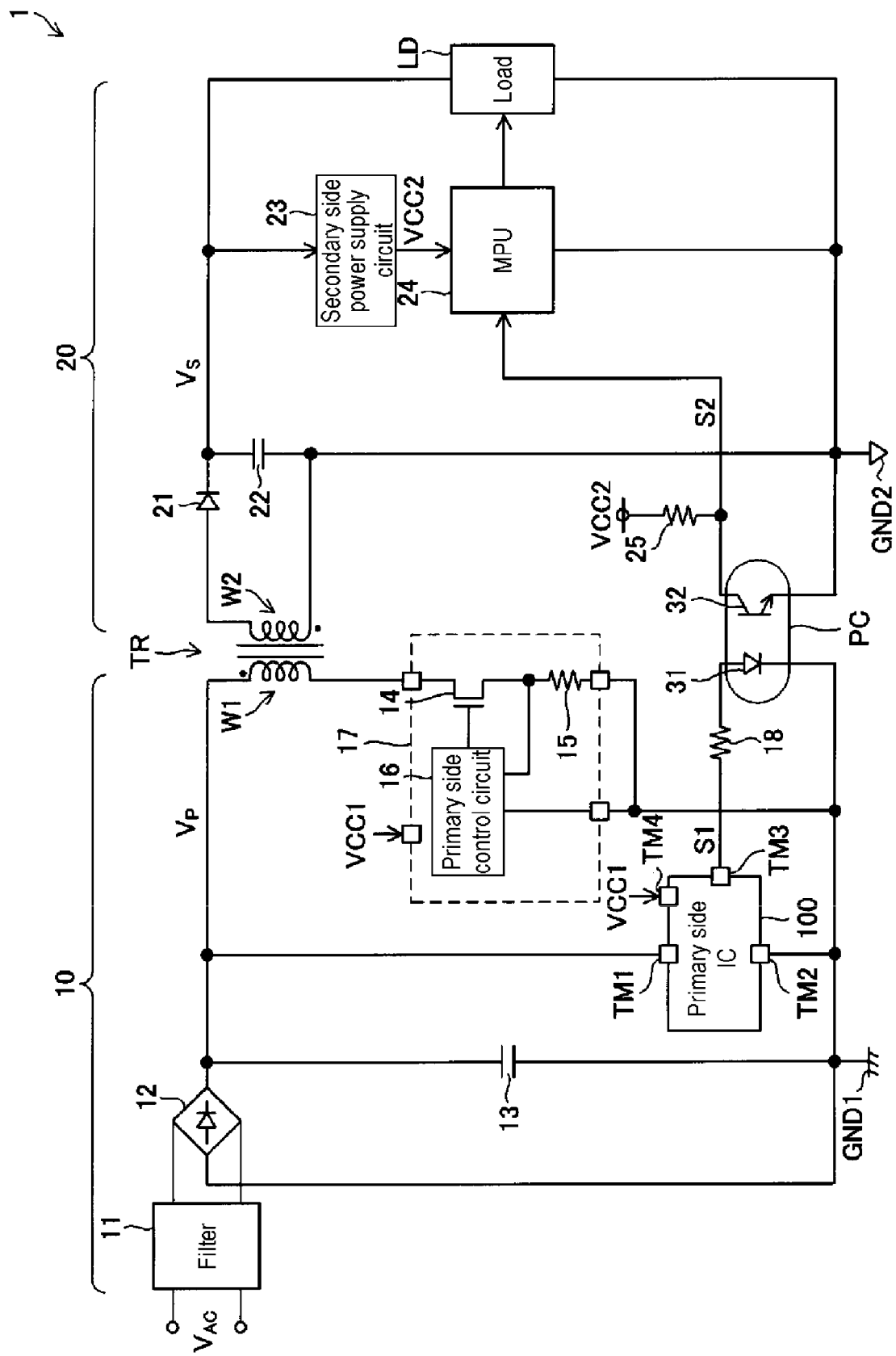
FIG. 1 is a view showing an overall configuration of a load driving device according to a first embodiment of the present disclosure.

Embodiments of the present disclosure will be now described in detail with reference to the drawings. Like or equivalent components, members, and processes illustrated in each drawing are given like reference numerals and a repeated description thereof will be properly omitted. In the present disclosure, for the purpose of simplification of description, by denoting information, signals, physical quantities, elements, members, or the like with reference symbols or marks, the names of information, signals, physical quantities, elements, members, or the like corresponding to the symbols or marks may be omitted or abbreviated. For example, a primary side IC referred to as "100" to be described later (see FIG. 1) may be expressed as a primary side IC 100 or an IC 100, but they are all the same.

First, some terms used in the present embodiments will be described. In the present embodiments, an IC is an abbreviation for integrated circuit. A level refers to a potential level. For any signal or voltage, a high level has a higher potential than that of a low level. For an arbitrary signal or voltage whose level is periodically switched between a low level and a high level, a ratio of a length of an interval in which the signal or voltage is at the high level to a length of an interval of one cycle of the signal or voltage is called a duty. For any transistor configured as a FET (Field Effect Transistor), an on state refers to a conductive state between a drain and a source of the transistor, and an off state refers to a non-conducting state (cut-off state) between the drain and source of the transistor. Hereinafter, the on state and the off state may be simply expressed as on and off.

First Embodiment

A first embodiment of the present disclosure will be described. FIG. 1 is view showing an overall configuration of a load driving device 1 according to a first embodiment of the present disclosure. The load driving device 1 includes a primary side circuit 10 which is a circuit provided on a primary side, and a secondary side circuit 20 which is a circuit provided on a secondary side. In the load driving device 1, the primary side and the secondary side are electrically insulated from each other. In other words, the primary side circuit 10 and the secondary side circuit 20 are electrically insulated from each other. The load driving device 1 further includes a transformer TR and a photo coupler PC provided across the primary side circuit 10 and the secondary side circuit 20. The transformer TR includes a primary side winding W1 arranged in the primary side circuit 10, and a secondary side winding W2 arranged in the secondary side circuit 20. In the transformer TR, the primary side winding W1 and the secondary side winding W2 are magnetically coupled to each other with reverse polarities while being electrically insulated from each other. The photo coupler PC includes a light emitting element 31 arranged in the primary side circuit 10, and a light receiving element 32 arranged in the secondary side circuit 20.

In the load driving device 1, a secondary side voltage $V_S$ is generated in an insulated form from a primary side voltage $V_P$ using the transformer TR. The ground in the primary side circuit 10 is referred to as "GND1," and the ground in the secondary side circuit 20 is referred to as "GND2." The primary side voltage $V_P$ is a voltage based on the ground GND1, and the secondary side voltage $V_S$ is a voltage based on the ground GND2. In each of the primary side circuit 10 and the secondary side circuit 20, the ground refers to a conductive portion (predetermined potential point) having a reference potential of 0V (zero volt) or the reference potential itself. However, since the ground GND1 and the ground GND2 are electrically insulated from each other, they can have different potentials.

The primary side circuit 10 will be described. The primary side circuit 10 includes a filter 11, a rectifier circuit 12, a smoothing capacitor 13, a switching transistor 14, a sense resistor 15, a primary side control circuit 16 and a resistor 18. The switching transistor 14 is configured as an N-channel metal-oxide-semiconductor field-effect transistor (MOSFET).

The filter 11 removes noise of an AC voltage $V_{AC}$ input to the load driving device 1. The AC voltage $V_{AC}$ may be a commercial AC voltage. The rectifier circuit 12 is a diode bridge circuit that full-wave rectifies the AC voltage $V_{AC}$ supplied through the filter 11. The smoothing capacitor 13 generates the primary side voltage $V_P$ by smoothing the voltage that has been full-wave rectified by the rectifier circuit 12. The primary side voltage $V_P$ is applied between both ends of the smoothing capacitor 13 with respect to the ground GND1. The primary side voltage $V_P$ is a positive DC voltage having a voltage value corresponding to an effective value of the AC voltage $V_{AC}$. The primary side voltage $V_P$ may pulsate slightly in the cycle of the AC voltage $V_{AC}$, but the pulsation is ignored here.

The primary side voltage $V_P$ is applied to one end of the primary side winding W1, and the other end of the primary side winding W1 is connected to a drain of the switching transistor 14. A source of the switching transistor 14 is connected to the ground GND1 via the sense resistor 15. A voltage signal indicating a voltage drop at the sense resistor 15 is input to the primary side control circuit 16.

The primary side control circuit 16 is connected to a gate of the switching transistor 14 and supplies a pulse signal to the gate of the transistor 14 to control a gate voltage of the transistor 14, thereby switching the transistor 14. The pulse signal is a rectangular wave signal whose signal level is switched between a low level and a high level. When low level and high level signals are supplied to the gate of the transistor 14, the transistor 14 is in an off state and an on state, respectively. A method for controlling the transistor 14 is not particularly limited. For example, the load driving device 1 may be configured such that a feedback signal corresponding to the secondary side voltage $V_S$ is transmitted to the primary side control circuit 16. In this case, the primary side control circuit 16 may supply a pulse signal having a duty corresponding to the feedback signal to the gate of the switching transistor 14 using pulse width modulation, or may supply a pulse signal having a frequency corresponding to the feedback signal to the gate of the switching transistor 14 using pulse frequency modulation. As a further example, the primary side control circuit 16 may adjust the duty of the pulse signal according to a voltage drop at the sense resistor 15 (that is, according to a current flowing through the switching transistor 14).

Here, it is assumed that a primary side power supply IC 17 is provided in the primary side circuit 10, and the transistor 14, the sense resistor 15, and the primary side control circuit 16 are formed in the primary side power supply IC 17. However, the transistor 14 and the sense resistor 15 may be provided as discrete components outside the primary side power supply IC 17. The primary side power supply IC 17 is driven based on a power supply voltage VCC1, which is a DC voltage. The power supply voltage VCC1 is a power supply voltage on the primary side with respect to the ground GND1. An auxiliary winding (not shown) may be provided on the primary side of the transformer TR. In this case, the power supply voltage VCC1 may be generated by rectifying an induced voltage generated in the auxiliary winding when the switching transistor 14 is switched. Alternatively, a DC/DC converter (not shown), which generates the power supply voltage VCC1 by DC/DC conversion of the primary side voltage $V_P$, may be provided in the primary side circuit 10.

Figure 2:
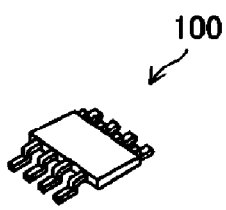
FIG. 2 is an external view of a primary side IC according to the first embodiment of the present disclosure.

A primary side IC 100 is further provided in the primary side circuit 10. FIG. 2 shows an example of an appearance of the primary side IC 100. The primary side IC 100 is an electronic component (semiconductor device) formed by enclosing a semiconductor integrated circuit in a housing (package) made of resin. Each circuit constituting the primary side IC 100 is integrated within a semiconductor. The housing of the electronic component as the primary side IC 100 is provided with a plurality of external terminals exposed from the housing to the outside of the IC 100. Further, the number of external terminals shown in FIG. 2 is merely an example.

The plurality of external terminals provided in the primary side IC 100 includes external terminals TM1 to TM4. The external terminal TM1 is connected to a wiring to which the primary side voltage $V_P$ is applied, and receives the primary side voltage $V_P$. The external terminal TM2 is connected to the ground GND1. The external terminal TM4 receives the power supply voltage VCC1. The primary side IC 100 is driven based on the power supply voltage VCC1. A voltage information signal S1 indicating voltage information corresponding to the primary side voltage $V_P$ is output from the external terminal TM3. A series circuit of the light emitting element 31 of the photo coupler PC and the resistor 18 is interposed between the external terminal TM3 and the ground GND1, and the voltage information signal S1 is input to the series circuit. The resistor 18 is provided to adjust a current supplied to the light emitting element 31. The resistor 18 may be provided in the primary side circuit 100. Details of the internal configuration and operation of the primary side IC 100 will be described later.

The secondary side circuit 20 will be described. The secondary side circuit 20 includes a rectifier diode 21, a smoothing capacitor 22, a secondary side power supply circuit 23, an MPU (Micro Processing Unit) 24, a resistor 25, and a load LD.

In the transformer TR, one end of the secondary side winding W2 is connected to an anode of the rectifier diode 21, and the other end of the secondary side winding W2 is connected to the ground GND2. A cathode of the rectifier diode 21 is connected to one end of the smoothing capacitor 22, and the other end of the smoothing capacitor 22 is connected to the ground GND2. Therefore, when the switching transistor 14 is turned on, a current based on the primary side voltage $V_P$ flows through the primary side winding W1 and energy is accumulated in the primary side winding W1. Thereafter, when the switching transistor 14 is turned off, the accumulated energy is output from the secondary side winding W2 to the smoothing capacitor 22 through the rectifier diode 21. As a result, the secondary side voltage $V_S$ is generated between both ends of the smoothing capacitor 22. The secondary side voltage $V_S$ is a positive DC voltage having a voltage value corresponding to the primary side voltage $V_P$ and a ratio of the number of turns of the primary side winding W1 and the number of turns of the secondary side winding W2. Although the secondary side voltage $V_S$ may be slightly pulsated, such pulsation is ignored here. The number of turns of the secondary side winding W2 is smaller than the number of turns of the primary side winding W1, and therefore, the secondary side voltage $V_S$ is lower than the primary side voltage $V_P$ (that is, the secondary side voltage $V_S$ has a voltage value lower than the primary side voltage $V_P$).

The secondary side power supply circuit 23 is a DC/DC converter that generates a DC voltage VCC2 from the secondary side voltage $V_S$. The DC voltage VCC2 has a predetermined positive DC voltage value (for example, 5V). The DC voltage VCC2 functions as a power supply voltage on the secondary side with respect to the ground GND2.

Figure 3:
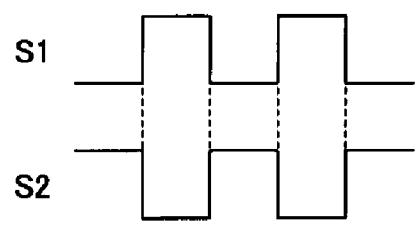
FIG. 3 is a view showing a relationship between two signals related to transmission of voltage information according to the first embodiment of the present disclosure.

The MPU 24 includes a terminal for receiving the power supply voltage VCC2, and a terminal connected to the ground GND2, and is driven based on the power supply voltage VCC2. A process executed by the MPU 24 includes control of the load LD. The MPU 24 receives a signal S2 based on the voltage information signal S1. The signal S2 is provided from the photo coupler PC. Specifically, for example, the light receiving element 32 of the photo coupler PC is constituted by a phototransistor, and the current of the phototransistor is controlled according to the voltage information signal S1 input to the light emitting element 31 of the photo coupler PC. The voltage VCC2 (or another DC voltage that can be generated by the secondary side power supply circuit 23) is applied to one end of the resistor 25. The phototransistor serving as the light receiving element 32 is interposed between the other end of the resistor 25 and the ground GND2, and the signal S2 is generated at a connection node between the other end of the resistor 25 and the light receiving element 32. Therefore, as shown in FIG. 3, when the voltage information signal S1 is at a high level, the light emitting element 31 emits light. As a result, a current flows through the light receiving element 32, and the signal S2 is a low level. Conversely, when the voltage information signal S1 is at a low level, the light emitting element 31 does not emit light. As a result, no current flows through the light receiving element 32, so that the signal S2 is a high level.

Since the voltage information signal S1 includes voltage information corresponding to the primary side voltage $V_P$, the signal S2 is also a voltage information signal including the voltage information corresponding to the primary side voltage $V_P$. The MPU 24 can control the load LD according to the signal S2. The load LD is interposed between a wiring to which the secondary side voltage $V_S$ is applied and the ground GND2, and is driven based on the secondary side voltage $V_S$.

Further, in this example, the secondary side voltage $V_S$ is generated by a diode rectification method (asynchronous rectification method) and a flyback method. However, in the load driving device 1, the secondary side voltage $V_S$ may be generated by the synchronous rectification method or a forward method.

Figure 4:
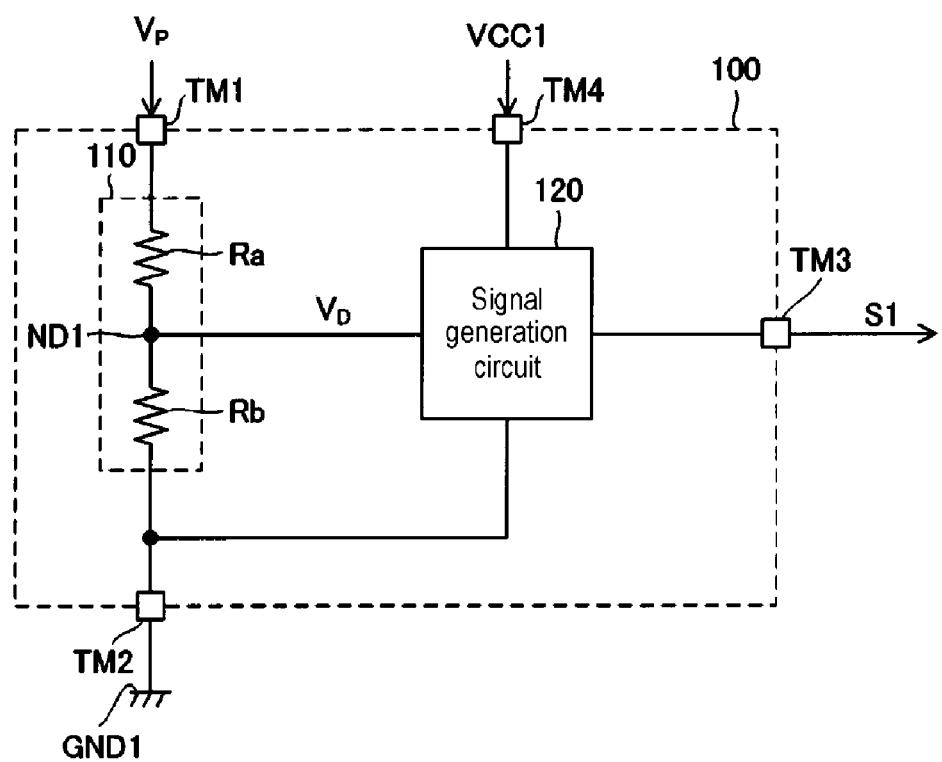
FIG. 4 is a schematic view showing an internal configuration of the primary side IC according to the first embodiment of the present disclosure.

FIG. 4 shows a schematic configuration of the primary side IC 100. The primary side IC 100 includes a voltage dividing resistor part 110 interposed between the external terminals TM1 and TM2, and a signal generation circuit 120 that is connected to the external terminals TM4 and TM2 and is driven based on the power supply voltage VCC1 supplied to the external terminal TM4. The voltage dividing resistor part 110 is constituted by voltage dividing resistors Ra and Rb and generates a voltage $V_D$ by dividing the primary side voltage $V_P$. Specifically, one end of the voltage dividing resistor Ra is connected to the external terminal TM1 to which the primary side voltage $V_P$ is applied, one end of the voltage dividing resistor Rb is connected to the external terminal TM2 connected to the ground GND1, and the other ends of the voltage dividing resistors Ra and Rb are connected in common at a node ND1. Accordingly, the voltage $V_D$ corresponding to the divided voltage of the primary side voltage $V_P$ is generated at the node ND1. The voltage $V_D$ is input to the signal generation circuit 120.

The signal generation circuit 120 generates the voltage information signal S1 corresponding to the input voltage $V_D$ and outputs the signal S1 at the external terminal TM3. The voltage information signal S1 is a signal depending on the voltage value of the input voltage $V_D$, and accordingly, contains voltage information indicating the voltage value of the primary side voltage $V_P$ (in other words, voltage information indicating the voltage value of the input voltage $V_D$). Since the input voltage $V_D$ is proportional to the primary side voltage $V_P$, generating the voltage information signal S1 according to the input voltage $V_D$ is equivalent to generating the voltage information signal S1 according to the primary side voltage $V_P$.

The voltage information signal S1 generated in the signal generation circuit 120 is a rectangular wave signal (that is, a pulse signal) whose signal level is switched between a low level and a high level. As long as the voltage information indicating the voltage value of the primary side voltage $V_P$ can be included in the voltage information signal S1, the modulation method of the voltage information signal S1 is arbitrary. That is, for example, the signal generation circuit 120 may generate a PWM signal, which is pulse width-modulated according to the primary side voltage $V_P$, as the voltage information signal S1, or may generate a PFM signal, which is pulse frequency-modulated according to the primary side voltage $V_P$, as the voltage information signal S1.

Figure 5A:
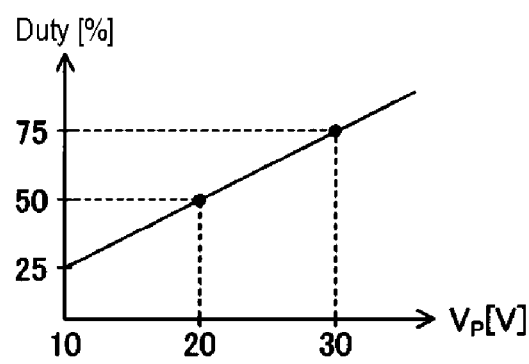
FIGS. 5A and 5B are views showing a relationship between a primary side voltage and a duty of a voltage information signal generated as a PWM signal according to the first embodiment of the present disclosure.
Figure 5B:
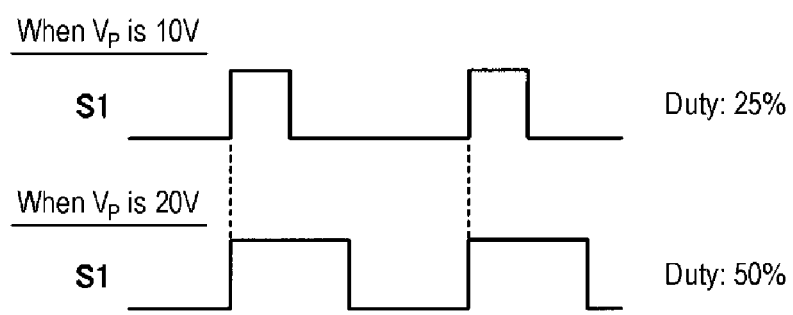

FIG. 5A shows a relationship between the duty of the voltage information signal S1 and the primary side voltage $V_P$ when the voltage information signal S1 is generated using pulse width modulation. For example, when the primary side voltage $V_P$ is 10V, 20V, and 30V, the duty of the voltage information signal S1 as the PWM signal is set to 25%, 50%, and 75%, respectively (see also FIG. 5B). Of course, this is merely an example of numerical values, and the relationship between the duty of the voltage information signal S1 and the primary side voltage $V_P$ can be arbitrarily set according to an assumed fluctuation range of the primary side voltage $V_P$. In the examples of FIGS. 5A and 5B, the duty of the voltage information signal S1 increases as the primary side voltage $V_P$ increases. However, an alternative configuration may be employed in which the duty of the voltage information signal S1 decreases as the primary side voltage $V_P$ increases.

FIG. 6A shows a relationship between a frequency of the voltage information signal S1 and the primary side voltage $V_P$ when the voltage information signal S1 is generated using the pulse frequency modulation. For example, when the primary side voltage $V_P$ is 10V, 20V, and 30V, the frequency of the voltage information signal S1 as the PFM signal is set to 10 Hz, 50 Hz, and 90 Hz, respectively (see also FIG. 6B). Of course, this is merely an example of numerical values, and the relationship between the frequency of the voltage information signal S1 and the primary side voltage $V_P$ can be arbitrarily set according to an assumed fluctuation range of the primary side voltage $V_P$. In the examples of FIGS. 6A and 6B, the frequency of the voltage information signal S1 increases as the primary side voltage $V_P$ increases. However, an alternative configuration may be employed in which the frequency of the voltage information signal S1 decreases as the primary side voltage $V_P$ increases.

The voltage information included in the voltage information signal S1 (that is, voltage information indicating the voltage value of the primary side voltage $V_P$) is also included in the signal S2, and the MPU 24 can use the voltage information included in the signal S2 for various controls of the load LD.

Figure 7:
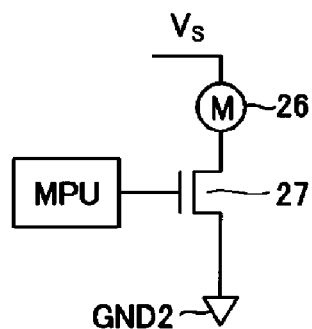
FIG. 7 is a peripheral circuit diagram of a motor as a load according to the first embodiment of the present disclosure.

Now, a case is considered where the load LD includes a motor 26 which is a DC motor. As an example, as shown in FIG. 7, a case is considered where the motor 26 and a transistor 27 configured as an N-channel MOSFET are arranged in series between a wiring to which the secondary side voltage $V_S$ is applied and the ground GND2. In this case, the MPU 24 can pulse-drive the motor 26 by alternately turning the transistor 27 on and off, and can control the number of rotations of the motor 26 by controlling an on-duty of the transistor 27. The on-duty of the transistor 27 refers to a ratio of a length of an interval in which the transistor 27 is turned on to a sum of the length of the interval in which the transistor 27 is turned on and a length of an interval in which the transistor 27 is turned off.

If the on-duty of the transistor 27 is fixed, the number of rotations of the motor 26 decreases when the secondary side voltage $V_S$ decreases as the primary side voltage $V_P$ decreases. Conversely, the number of rotations of the motor 26 increases when the secondary side voltage $V_S$ increases as the primary side voltage $V_P$ increases. However, the MPU 24 may control the pulse driving of the motor 26 based on the signal S2 such that the number of rotations of the motor 26 is kept constant. That is, the on-duty of the transistor 27 may be relatively reduced when the signal S2 indicating that the primary side voltage $V_S$ is relatively high is received, and may be relatively increased when the signal S2 indicating that the primary side voltage $V_S$ is relatively low is received.

The MPU 24 may be provided with an overcurrent protection function. In the overcurrent protection function, a current flowing through the motor 26 (hereinafter, referred to as a motor current) is monitored, and when the value of the motor current detected to be equal to or greater than a predetermined overcurrent threshold value, the transistor 27 is immediately switched from on to off to cut off the current supply to the motor 26. The motor current may be monitored by monitoring a drain-source voltage of the transistor 27, or may be monitored by monitoring a voltage drop across a resistor disposed on a path through which the motor current flows.

The overcurrent threshold value can be changed appropriately depending on the primary side voltage $V_P$. Typically, for example, when the AC voltage $V_{AC}$ input to the load driving device 1 is a commercial AC voltage, the effective value of the AC voltage $V_{AC}$ may be 100V or 200V depending on a region where the load driving device 1 is used. However, an appropriate overcurrent threshold value differs depending on whether the effective value of the AC voltage $V_{AC}$ is 100V or 200V. Considering this, the MPU 24 may variably set the overcurrent threshold value based on the signal S2. That is, for example, the overcurrent threshold value may be switched between different first and second threshold values depending on whether or not the voltage value of the primary side voltage $V_P$ indicated by the signal S2 is equal to or greater than a predetermined value.

Further, when the primary side voltage $V_P$ is abnormally high so that the secondary side voltage $V_S$ also becomes abnormally high, the MPU 24 may stop driving the motor 26 in order to protect the motor 26. That is, for example, when the signal S2 indicates that the voltage value of the primary side voltage $V_P$ is equal to or higher than a predetermined upper limit voltage value, the MPU 24 may stop driving the motor 26 by keeping the transistor 27 off.

Further, when the primary side voltage $V_P$ is abnormally low so that the secondary side voltage $V_S$ also becomes abnormally low, it is possible to secure the drive voltage of the motor 26 by starting a booster circuit (not shown). The booster circuit is provided in the secondary side circuit 20 and can boost the secondary side voltage $V_S$ to generate a boosted voltage higher than the secondary side voltage $V_S$ under control of the MPU 24. In principle, the booster circuit is stopped, and when the booster circuit is stopped, the motor 26 is driven by the secondary side voltage $V_S$ as described above. However, when the signal S2 indicates that the voltage value of the primary side voltage $V_P$ is equal to or smaller than a predetermined lower limit voltage value, the MPU 24 may activate the booster circuit to drive the motor 26 with the boosted voltage. The booster circuit may also be considered as a part of the load LD.

Considering a case where the load LD includes the motor 26, the control of the load LD based on the signal S2 has been described. However, a type of the load LD driven by the secondary side voltage $V_S$ is arbitrary, and the present disclosure can be used for various applications that require changing the control according to the level of the secondary side voltage $V_S$. For example, when the load LD includes a component responsible for heating a heating cooker, a cooking temperature increases or decreases depending on the increase or decrease of the secondary side voltage $V_S$. Therefore, it is also conceivable to adjust the heating time (a length of time during which cooking material is heated) according to the voltage information of the primary side voltage $V_P$ included in the signal S2. Further, for example, it is also conceivable to configure the load LD so as to realize any of a plurality of functions and switch the function actually realized by the load LD according to the voltage information of the primary side voltage $V_P$ included in the signal S2.

When the AC voltage $V_{AC}$ input to the load driving device 1 is a commercial AC voltage, the effective value of the AC voltage $V_{AC}$ may be accurately maintained near the target value (for example, 100V or 200V). However, depending on a region where the load driving device 1 is used, the commercial AC voltage may not be stable, and the AC voltage $V_{AC}$ may vary greatly. The fluctuation of the AC voltage $V_{AC}$ causes the fluctuation of the primary side voltage $V_P$. In addition, when a power consumption in a power system of the AC voltage $V_{AC}$ is increased, the AC voltage $V_{AC}$ may be much lower than a target value. Further, when an electric outlet, which is connected to the load driving device 1 and receives the AC voltage $V_{AC}$, is plugged/unplugged, the primary side voltage $V_P$ becomes considerably smaller than that in the stable state. The load driving device 1 can cope with these various situations.

According to the load driving device 1 of the present embodiment, the voltage information of the primary side voltage $V_P$ can be transmitted to the secondary side, and can be used in various ways in the secondary side circuit 20. Further, since the signal generation circuit 120 that generates the voltage information signal S1 and the voltage dividing resistor part 110 are integrated into an IC, the number of components can be reduced as compared with a configuration in which voltage dividing resistance is provided as a discrete component. As a result, a reduction in the failure rate of the entire apparatus is expected.

Second Embodiment

A second embodiment of the present disclosure will be described. The second embodiment and third to sixth embodiments to be described later are embodiments based on the first embodiment. Regarding matters not specifically described in the second to sixth embodiments, the description of the first embodiment is applicable to the second to sixth embodiments unless contradictory. In interpreting the description of the second embodiment, the description of the second embodiment may be given priority for matters that are contradictory between the first and second embodiments (the same applies to the third to sixth embodiments to be described later). Unless contradictory, the first to sixth embodiments may be used in any combination.

Figure 8:
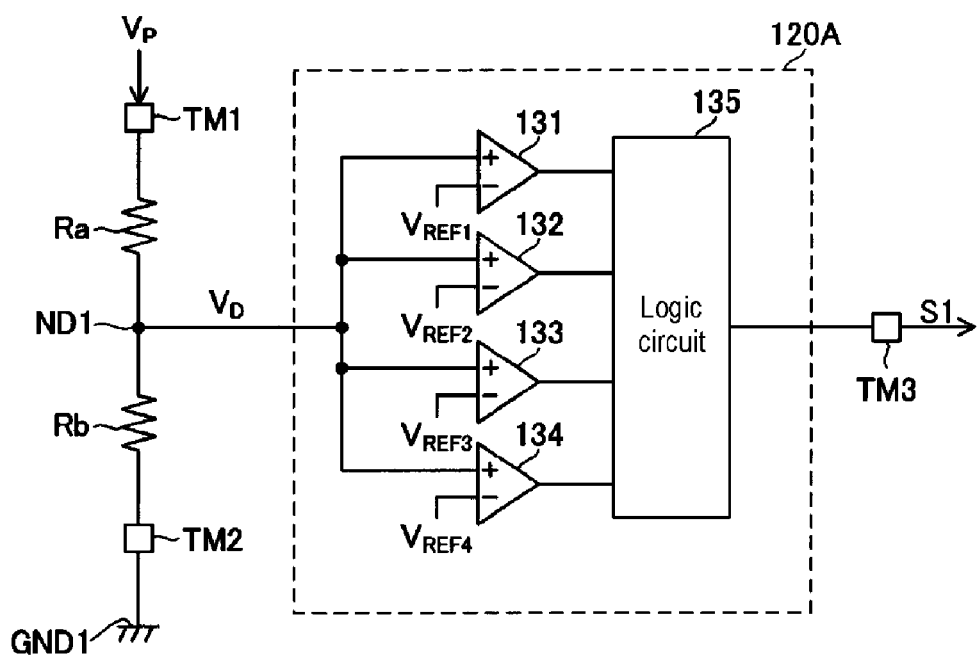
FIG. 8 is a view showing an example of a configuration of a signal generation circuit according to a second embodiment of the present disclosure.

FIG. 8 shows a configuration of a signal generation circuit 120A as an example of the signal generation circuit 120. The signal generation circuit 120A includes comparators 131 to 134 and a logic circuit 135. An input voltage $V_D$ for the signal generation circuit 120A is supplied to each of the non-inverting input terminals of the comparators 131 to 134. Predetermined reference voltages $V_{REF1}$, $V_{REF2}$, $V_{REF3}$, and $V_{REF4}$ are applied to the inverting input terminals of the comparators 131, 132, 133 and 134, respectively. A low level or high level signal is output from each of the comparators. The reference voltages $V_{REF1}$, $V_{REF2}$, $V_{REF3}$, and $V_{REF4}$ are generated in the primary side IC 100 based on the power supply voltage VCC1 and are positive DC voltages with respect to the ground GND1. In this example, a relationship of "$0<V_{REF1}<V_{REF2}<V_{REF3}<V_{REF4}$" is established. For example, the reference voltages $V_{REF1}$, $V_{REF2}$, $V_{REF3}$, and $V_{REF4}$ can be set to 1V, 2V, 3V, and 4V, respectively. In this case, if the resistance values of the voltage dividing resistors Ra and Rb are 9 MΩ and 1 MΩ, respectively, the primary side voltage $V_P$ is compared with 10V, 20V, 30V, and 40V by the comparators 131, 132, 133 and 134, respectively.

The comparators 131 to 134 compare the input voltage $V_D$ with the reference voltages $V_{REF1}$ to $V_{REF4}$ and output signals indicating results of the comparison. Specifically, the output signals of the comparators 131, 132, 133, and 134 are as follows:

when "$V_D<V_{REF1}$" is established, all have a low level (referred to a first output pattern), when "$V_{REF1}\leq V_D<V_{REF2}$" is established, they have a high level, a low level, a low level and a low level, respectively (referred to as a second output pattern), when "$V_{REF2}\leq V_D<V_{REF3}$" is established, they have a high level, a high level, a low level and a low level, respectively (referred to as a third output pattern), when "$V_{REF3}\leq V_D<V_{REF4}$" is established, they have a high level, a high level, a high level and a low level, respectively (referred to as a fourth output pattern), and when "$V_{REF4}\leq V_D$" is established, all have a high level (a fifth output pattern).

The logic circuit 135 generates the voltage information signal S1 corresponding to the output signals of the comparators 131 to 134 and outputs it at the external terminal TM3. When pulse width modulation is used, the duty of the voltage information signal S1 may be controlled according to the output signals of the comparators 131 to 134 (that is, the duty of the voltage information signal S1 may differ among the first to fifth output patterns). When pulse frequency modulation is used, the frequency of the voltage information signal S1 may be controlled according to the output signals of the comparators 131 to 134 (that is, the frequency of the voltage information signal S1 may differ among the first to fifth output patterns).

In the configuration example of FIG. 8, the primary side voltage $V_P$ is detected in five steps by providing the four comparators for the signal generation circuit 120A. However, the number of comparators provided in the signal generation circuit 120A is a selectable option. Although one is possible, the number of comparators may be 2 or more in consideration of detection resolution. Further, in order to prevent the input signal to the logic circuit 135 from changing frequently when the input voltage $V_D$ is in the vicinity of any reference voltage, a hysteresis may be provided for the voltage comparison in each comparator.

Third Embodiment

Figure 9:
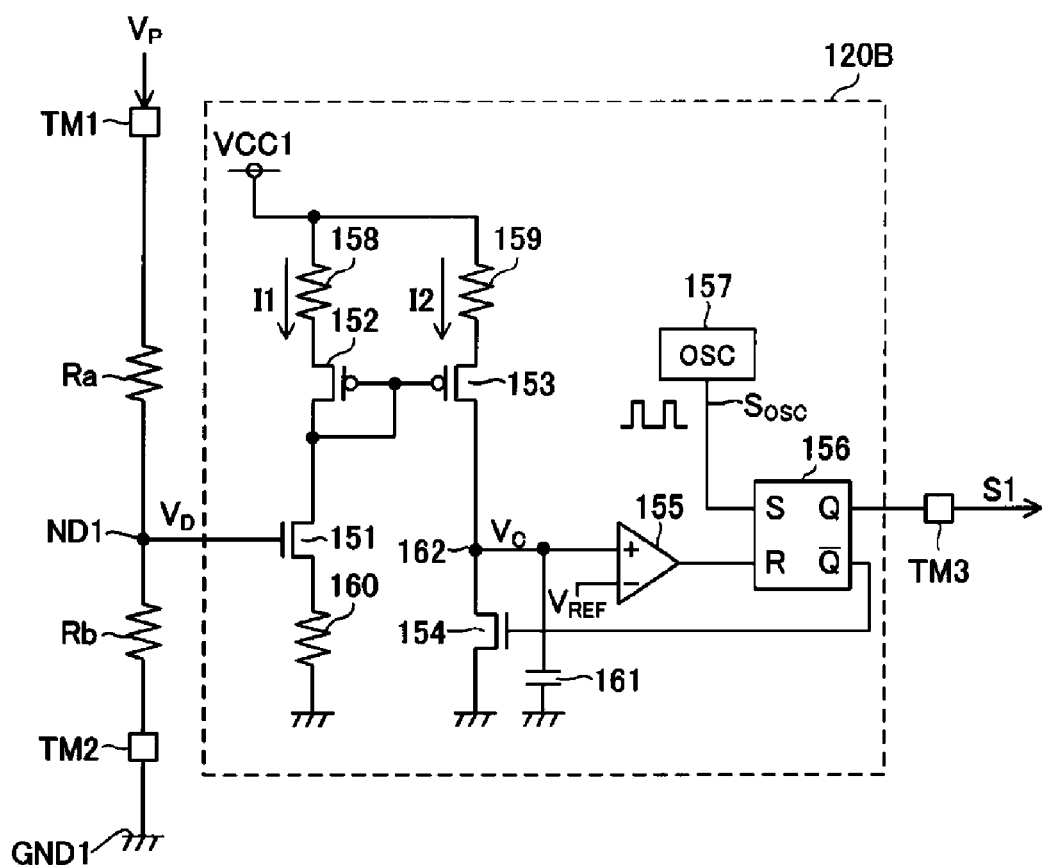
FIG. 9 is a view showing an example of a configuration of a signal generation circuit according to a third embodiment of the present disclosure.

A third embodiment of the present disclosure will be described. FIG. 9 shows a configuration of a signal generation circuit 120B as another example of the signal generation circuit 120. The signal generation circuit 120B includes transistors 151 to 154, a comparator 155, an FF 156 which is an RS flip-flop, an oscillator 157, resistors 158 to 160, and a capacitor 161. The transistors 151 and 154 are configured as N-channel MOSFETs, and the transistors 152 and 153 are configured as P-channel MOSFETs.

By connecting a gate of the transistor 151 to the node ND1, an input voltage $V_D$ to the signal generation circuit 120B is applied to the gate of the transistor 151. A source of the transistor 151 is connected to the ground GND1 via the resistor 160. A drain of the transistor 151, a drain and a gate of the transistor 152, and a gate of the transistor 153 are connected to each other. A source of the transistor 152 is connected to one end of a resistor 158, and the power supply voltage VCC1 is applied to the other end of the resistor 158. A source of the transistor 153 is connected to one end of the resistor 159, and the power supply voltage VCC1 is applied to the other end of the resistor 159. Drains of the transistors 153 and 154 are connected in common to a node 162. A source of the transistor 154 is connected to the ground GND1. A capacitor 161 is interposed between the node 162 and the ground GND1. A voltage at the node 162 viewed from the ground GND1 is referred to as a symbol "$V_C$." The voltage $V_C$ is equal to a voltage across the capacitor 161.

The voltage $V_C$ and a predetermined reference voltage $V_{REF}$ are supplied to a non-inverting input terminal and an inverting input terminal of the comparator 155, respectively. The reference voltage $V_{REF}$ is generated in the primary side IC 100 based on the power supply voltage VCC1 and is a positive DC voltage with respect to the ground GND1. The comparator 155 compares the voltage $V_C$ and the reference voltage $V_{REF}$. The comparator 155 outputs a high level signal when the voltage $V_C$ is equal to or higher than the reference voltage $V_{REF}$, and outputs a low level signal when the voltage $V_C$ is lower than the reference voltage $V_{REF}$. The output signal of the comparator 155 is supplied to a reset input terminal of the FF 156. A clock signal $S_{OSC}$ from the oscillator 157 is supplied to a set input terminal of the FF 156. The oscillator 157 generates the clock signal $S_{OSC}$ having a predetermined frequency. The clock signal $S_{OSC}$ is a rectangular wave signal whose signal level is switched between a low level and a high level. In the clock signal $S_{OSC}$, switching from a low level to a high level is repeated periodically.

The FF 156 has a first output terminal (Q terminal) and a second output terminal (inverted Q terminal), and outputs signals corresponding to logic values latched by FF 156 (that is, a retained logic value) from the first and second output terminals. The FF 156 latches a logic value of "1" when a high level signal is input to the set input terminal and a low level signal is input to the reset input terminal, and latches a logic value of "0" when a low level signal is input to the set input terminal and a high level signal is input to the reset input terminal. When both input signals to the set input terminal and the reset input terminal are at a low level, the logic value latched at this time is not changed. In the signal generation circuit 120B, both of the input signals to the set input terminal and the reset input terminal cannot have a high level.

In the FF 156, when the logic value "0" is latched, the output signals of the first and second output terminals are at a low level and a high level, respectively. When the logic value of "1" is latched, the output signals of the first and second output terminals are at a high level and a low level, respectively. A signal at the first output terminal (Q terminal) of the FF 156 is output from the external terminal TM3 as the voltage information signal S1. A signal at the second output terminal (inverted Q terminal) of the FF 156 is input to a gate of the transistor 154. Therefore, when the logic values of "0" and "1" are latched in the FF 156, the transistor 154 is turned on and off, respectively.

Further, a current flowing between the drain and the source of the transistor 152 is referred to as a current I1, and a current flowing between the drain and the source of the transistor 153 is referred to as a current I2. Since the transistors 152 and 153 form a current mirror circuit, the current I2 is proportional to the current I1.

Figure 10:
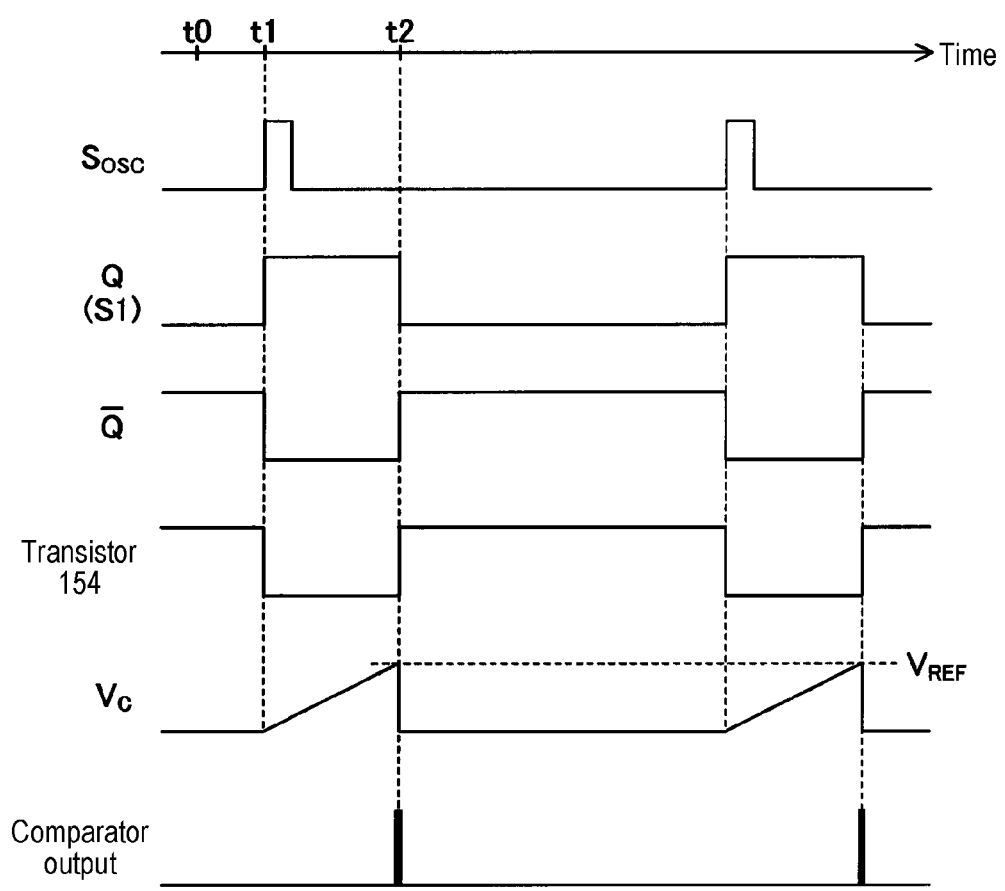
FIG. 10 is a timing chart of the signal generation circuit of FIG. 9 according to the third embodiment of the present disclosure.

An operation flow of the signal generation circuit 120B will be described with reference to FIG. 10. Consider a timing t0 at which the logic value of "0" is latched in the FF 156, as a starting point. At the timing t0, since the output signal (that is, the voltage information signal S1) from the first output terminal (Q terminal) of the FF 156 is at a low level, and the voltage $V_C$ is 0V because the transistor 154 is turned on. At a timing t1 after the timing t0, when the clock signal $S_{OSC}$ is switched from a low level to a high level, the logic value of "1" is latched in the FF 156, such that the output signal from the first output terminal of the FF 156 is switched from the low level to the high level and the output signal from the second output terminal of the FF 156 is switched from the high level to the low level. As a result, the transistor 154 is turned off. When the transistor 154 is turned off, charging of the capacitor 161 with the current I2 is started, and the voltage $V_C$, which is the terminal voltage of the capacitor 161, increases. At a timing t2, when the voltage $V_C$ reaches the reference voltage $V_{REF}$, the output signal of the comparator 155 is switched from the low level to the high level. Accordingly, the logic value of "0" is latched in the FF 156. When the logic value of "0" is latched in the FF 156, the output signal from the first output terminal of the FF 156 is switched from the high level to the low level, and the output signal from the second output terminal of the FF 156 is switched from the low level to the high level. Then, the voltage $V_C$ returns to 0V through the turn-on of the transistor 154, and the output signal of the comparator 155 also returns to the low level. Thereafter, the same operation is repeated.

In the configuration of FIG. 9, a current generation circuit that generates the currents I1 and I2 according to the primary side voltage $V_P$ is constituted by the transistors 151 to 153 and the resistors 158 to 160. Since the currents I1 and I2 also increase and decrease in conjunction with the increase and decrease of the primary side voltage $V_P$, the time between the timings t1 and t2 changes according to the primary side voltage $V_P$. On the other hand, switching the clock signal $S_{OSC}$ from the low level to the high level occurs at a constant cycle. Accordingly, a signal pulse width-modulated according to the primary side voltage $V_P$ is output from the first output terminal of the FF 156, as the voltage information signal S1, and the voltage value of the primary side voltage $V_P$ is expressed in the duty of the signal.

Fourth Embodiment

A fourth embodiment of the present disclosure will be described. In the primary side circuit 10, a relatively high voltage is applied to the external terminals TM1 and TM2. The fourth embodiment describes a structure of a semiconductor substrate focused on a breakdown voltage design, and the like.

Figure 11:
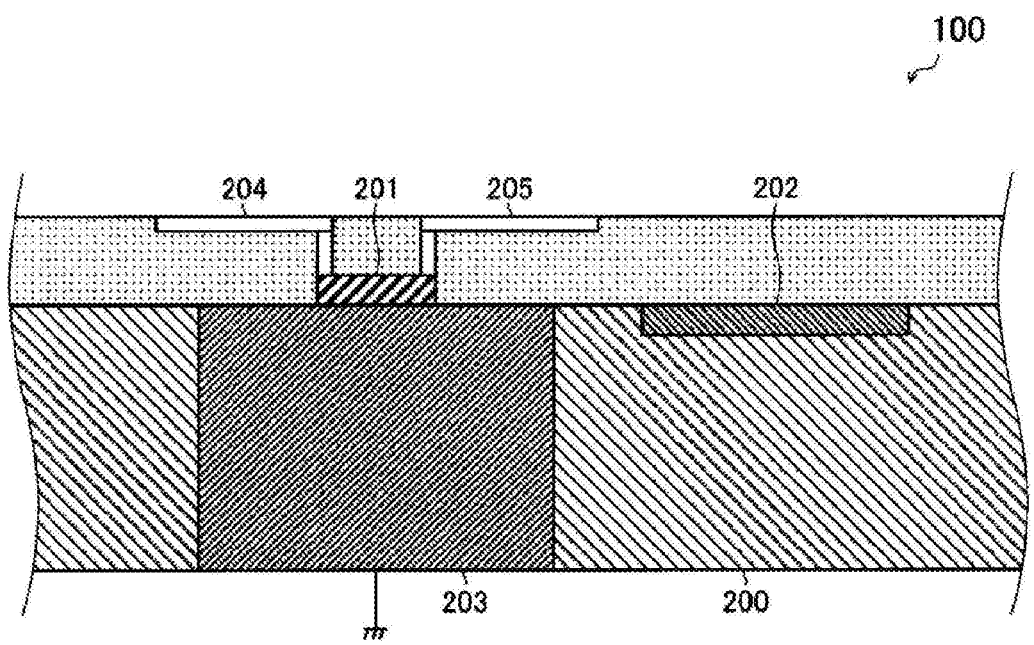
FIG. 11 is a longitudinal cross-sectional view schematically showing a region where a voltage dividing resistor part in a primary side IC is formed according to a fourth embodiment of the present disclosure.

FIG. 11 is a longitudinal cross-sectional view schematically showing a region where the voltage dividing resistor part 110 in the primary side IC 100 is formed. As shown in FIG. 11, the primary side IC 100 is formed by integrating a voltage dividing resistor part 201 and a signal generation part 202 on a single semiconductor substrate 200.

The voltage dividing resistor part 201 corresponds to the voltage dividing resistor part 110 described above. A metal wiring 204 connected to the external terminal TM1 is connected to a first end of the voltage dividing resistor part 201 through a via, and a metal wiring 205 connected to the external terminal TM2 is connected to a second end of the voltage dividing resistor part 201 through a via. Although not explicitly shown in FIG. 11, the voltage dividing resistor part 201 is also provided with the node ND1 (see FIG. 4). The above-described signal generation circuit 120 (see FIG. 4) is formed in the signal generation part 202.

Here, since a relatively large voltage (that is, the primary side voltage $V_P$) between the external terminals TM1 and TM2 is applied to the voltage dividing resistor part 201, the voltage dividing resistor part 201 may be formed with a polysilicon resistor having a high breakdown voltage (for example, a polysilicon resistor having a breakdown voltage of 400V or higher).

Further, when the voltage dividing resistor part 201 is integrated, it is necessary to achieve a high breakdown voltage not only in a path (horizontal direction) through the voltage dividing resistor part 201, but also between the voltage dividing resistor part 201 and a substrate potential end (vertical direction) (a potential of the ground GND1 is applied to the substrate potential end). Therefore, a high breakdown voltage region 203 having a higher breakdown voltage in a substrate thickness direction (vertical direction) than other regions is formed in the semiconductor substrate 200, and the voltage dividing resistor part 201 is formed on the high breakdown voltage region 203. That is, although the high breakdown voltage region 203 and other regions different from the high breakdown voltage region 203 are formed in the semiconductor substrate 200, the breakdown voltage of the high breakdown voltage region 203 in the substrate thickness direction is designed to be higher than the breakdown voltage of the other regions in the substrate thickness direction, and the voltage dividing resistor part 201 is disposed on the high breakdown voltage region 203. According to this configuration, since it is possible to achieve the high breakdown voltage of the voltage dividing resistor part 201, the primary side IC 100 can directly receive a relatively large primary side voltage $V_P$. Further, the signal generation part 202 is not provided on the high breakdown voltage region 203. The substrate thickness direction is a direction in which the thickness of the semiconductor substrate 200 is defined, and is parallel to normal lines of the front surface and the back surface of the semiconductor substrate 200.

As the high breakdown voltage region 203, a lateral double diffused metal oxide semiconductor field effect transistor (LDMOSFET) region with a rich track record of achieving the high breakdown voltage may be used.

Figure 12:
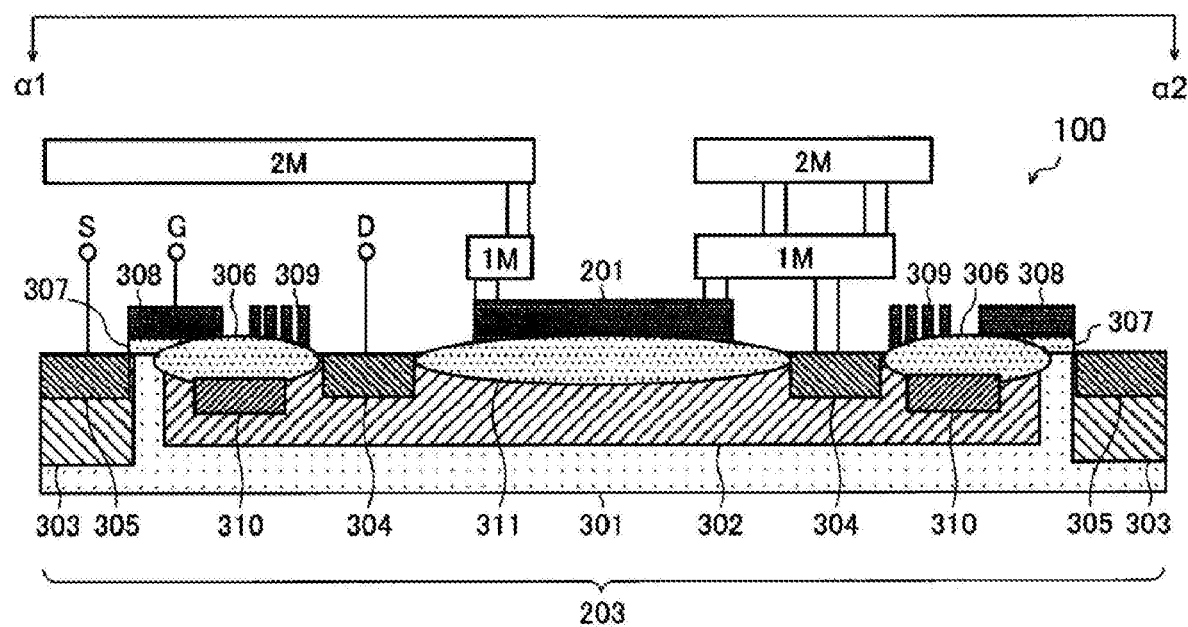
FIG. 12 is a longitudinal cross-sectional view showing an example of a structure of the primary side IC according to the fourth embodiment of the present disclosure.
Figure 13:
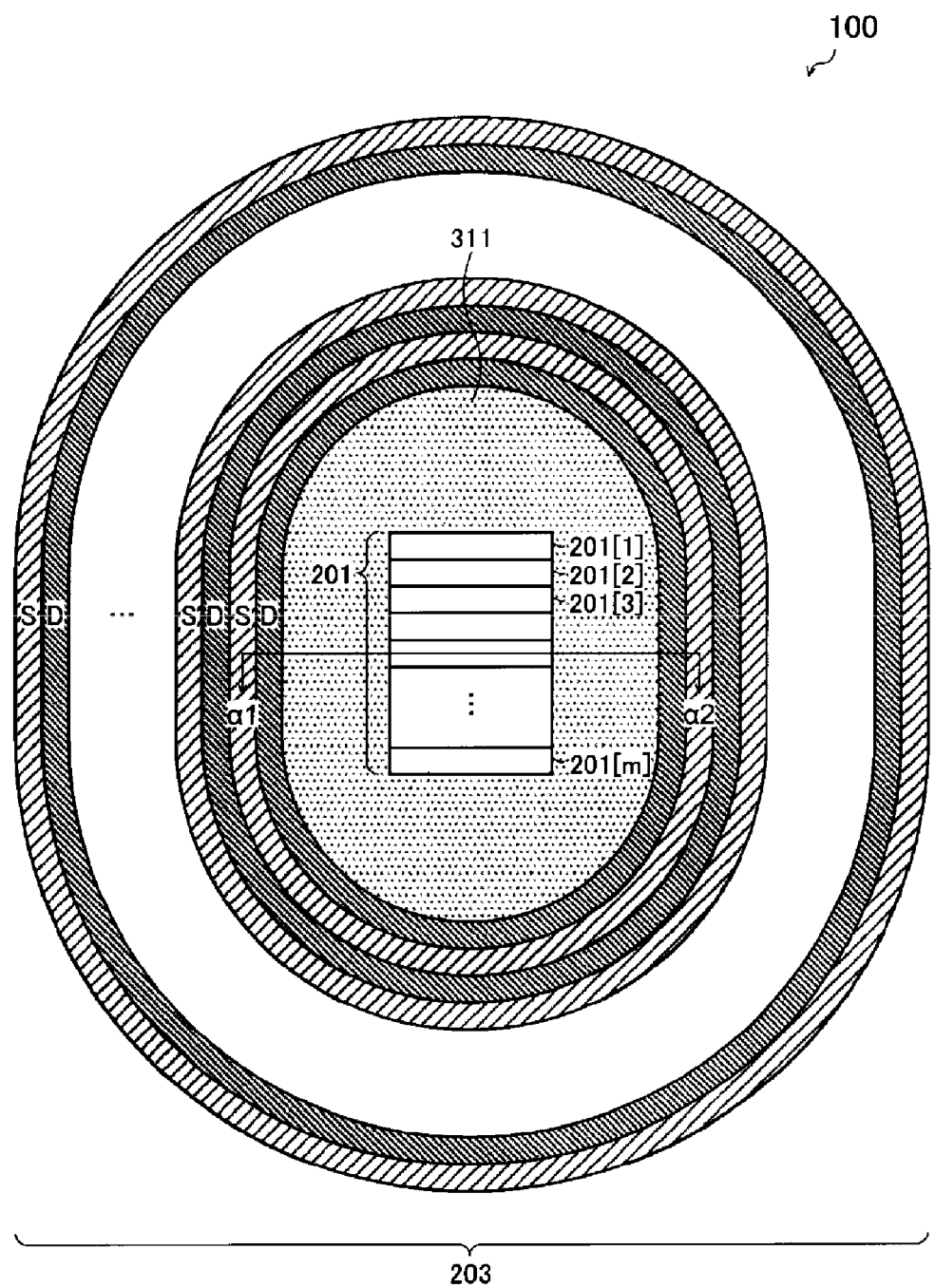
FIG. 13 is a top view showing an example of the structure of the primary side IC according to the fourth embodiment of the present disclosure.

The structure of the LDMOSFET region will be described in detail. FIGS. 12 and 13 are a longitudinal cross-sectional view and a plan view, respectively, showing an example of the structure of the primary side IC 100. The longitudinal cross-sectional view of FIG. 12 is a longitudinal cross-sectional view of the vicinity of a central portion of the high breakdown voltage region 203, and schematically shows α1-α2 cross section of FIG. 13.

The primary side IC 100 of FIG. 12 includes a p-type semiconductor substrate 301 as the above-described semiconductor substrate 200, and the high breakdown voltage region 203 is formed in the semiconductor substrate 301 as an LDMOSFET region. More specifically, in the p-type semiconductor substrate 301, a low-concentration n-type semiconductor region 302 and a high-concentration p-type semiconductor region 303 surrounding the region 302 are formed in the central portion of the high breakdown voltage region 203. Further, the breakdown voltage of the high breakdown voltage region 203 in the substrate thickness direction is increased by reducing the impurity concentration of the region 302 or increasing the thickness of the region 302.

A high-concentration n-type semiconductor region 304 is formed in the low-concentration n-type semiconductor region 302, and a high-concentration n-type semiconductor region 305 is formed in the high-concentration p-type semiconductor region 303. These high-concentration n-type semiconductor regions 304 and 305 correspond to the drain region and the source region of the LDMOSFET, respectively. The drain region and the source region of the LDMOSFET are denoted by symbols "D" and "S," respectively. As shown in FIG. 13, a plurality of concentric and ring-shaped drain regions (D) and source regions (S) are alternately formed in the high breakdown voltage region 203 in the plan view. That is, in the high breakdown voltage region 203 as the LDMOSFET region, a plurality of drain regions (D) each having a ring shape and a plurality of source regions (S) each having a ring shape are formed, the plurality of drain regions (D) and the plurality of source regions (S) are all formed concentrically (that is, the centers of these regions are coincident), and the drain regions (D) and the source regions (S) are alternately formed. When it is considered that the high breakdown voltage region 203 includes the first to n-th drain regions and the first to n-th source regions, the first drain region, the first source region, the second drain region, the second source region, . . . , the n-th drain region, and the n-th source region (n is an integer of 2 or more) are arranged in this order when viewed from a centers thereof. In a plan view of the p-type semiconductor substrate 301, an outer shape of the i-th drain region fits within an outer shape of the (i+1)-th drain region, and an outer shape of the i-th drain region fits within an outer shape of the i-th source region (i is an integer). Therefore, the first drain region corresponds to the innermost drain region in the first to n-th drain regions.

In addition, a field oxide film 306 is formed on an outer peripheral surface layer of the low-concentration n-type semiconductor region 302 so as to surround the high-concentration n-type semiconductor region 304. In addition, a gate oxide film 307 is formed on the surface layer of the p-type semiconductor substrate 301 between the high-concentration n-type semiconductor region 305 and the field oxide film 306. A gate region 308 (G) made of polysilicon is formed on the gate oxide film 307.

A field plate 309 made of polysilicon is formed on the field oxide film 306 as a means for equalizing an electric field distribution (that is, an interval between equipotential lines) to prevent a breakdown voltage breakdown.

A low-concentration p-type semiconductor region 310 is formed immediately below the field oxide film 306, as a means for forming a parasitic capacitance between the field oxide film 306 and the low-concentration n-type semiconductor region 302. With such a configuration, the breakdown voltage in the substrate thickness direction can be increased by the holding voltage of the parasitic capacitance.

As described above, a plurality of drain regions are concentrically formed in the high breakdown voltage region 203, but the high-concentration n-type semiconductor region 304 shown in FIG. 12 corresponds to the innermost peripheral drain region (that is, the first drain region) of the plurality of drain regions. A field oxide film 311 is formed in a central surface layer of the low-concentration n-type semiconductor region 302 surrounded by the innermost peripheral drain region (the high-concentration n-type semiconductor region 304 in FIG. 12), and the voltage dividing resistor part 201 is formed on the field oxide film 311. The voltage dividing resistor part 201 may be formed using the same polysilicon layer as the gate region 308 and the field plate 309. In the example of FIG. 12, both ends of the voltage dividing resistor part 201 are connected to the first metal layer 1M through respective vias. Further, the first metal layer 1M is connected to the second metal layer 2M through vias. However, the number of stacked metal layers is not limited thereto, but may be only one layer or may be three or more layers.

Further, as shown in FIG. 13, the voltage dividing resistor part 201 may be formed by combining a plurality of unit resistors 201[1] to 201[m] (where m is an integer of 2 or more). For example, when the resistance value per unit resistor is 1 MΩ and a combined resistance value of the voltage dividing resistor part 201 (that is, the total resistance value of the voltage dividing resistors Ra and Rb) is 10 MΩ, 10 unit resistors may be connected in series. In addition, when a connection configuration (series/parallel) of the unit resistors 201[1] to 201[m] and a position of the node ND1 in the unit resistors 201[1] to 201[m] can be arbitrarily changed, a voltage division ratio in the voltage dividing resistor part 201 can be easily set in a variable manner. In addition, a pad (not shown) to be connected to the external terminal TM1 may be formed on the second metal layer 2M located on the field oxide film 311.

Thus, by configuring the high breakdown voltage region 203 using the LDMOSFET region, the high breakdown voltage between the voltage dividing resistor part 201 and the p-type semiconductor substrate 301 can be realized.

Fifth Embodiment

Figure 14:
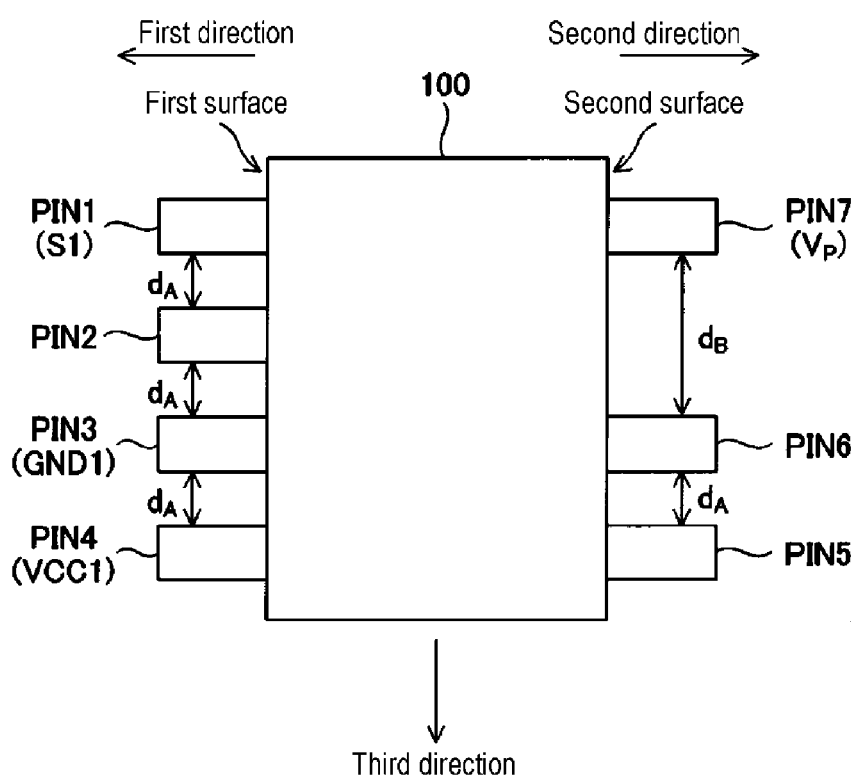
FIG. 14 is a view showing an example of an arrangement of external terminals in a primary side IC according to a fifth embodiment of the present disclosure.
Figure 15:
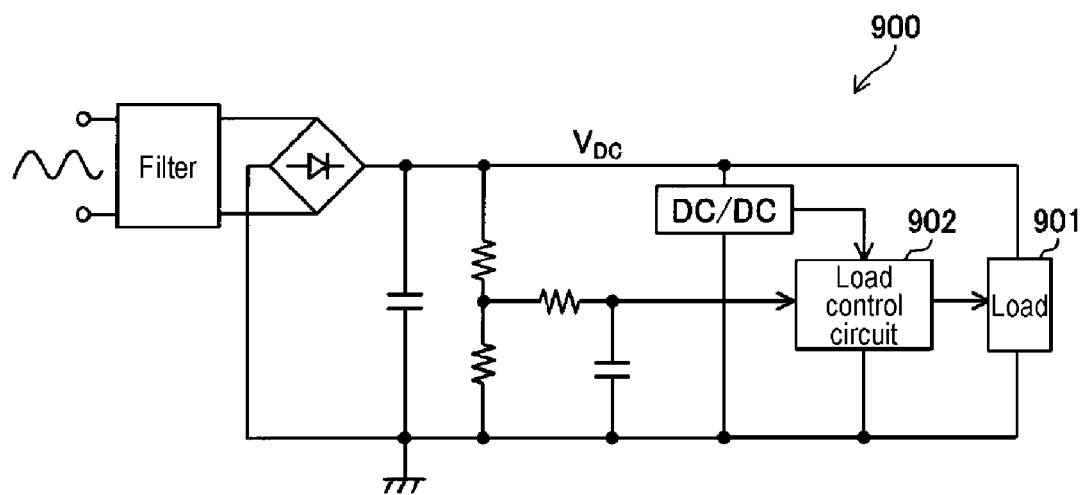
FIG. 15 is a view showing a configuration of a load control device in the related art.
Figure 16:
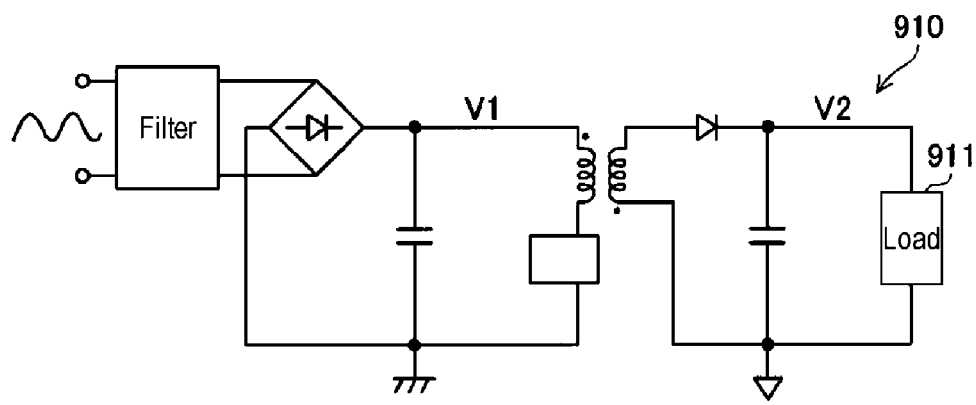
FIG. 16 is a view showing a configuration of another load control device in the related art.

A fifth embodiment of the present disclosure will be described. FIG. 14 shows an example of arrangement of external terminals in the primary side IC 100. A semiconductor substrate and a semiconductor integrated circuit forming the primary side IC 100 are sealed in a housing (package) made of resin. The housing of the primary side IC 100 has a substantially rectangular parallelepiped shape, external terminals PIN1 to PIN4 are provided to project from a first surface of the housing in a first direction, and external terminals PIN5 to PIN7 are provided to project from a second surface of the housing in a second direction. The first surface and the second surface are surfaces facing each other, and the second direction is a direction opposite to the first direction. The external terminals PIN1, PIN2, PIN3, and PIN4 are arranged in this order along a third direction orthogonal to the first direction and the second direction, and the external terminals PIN7, PIN6, and PIN5 are arranged in this order along the third direction. The external terminals PIN1 to PIN4 are arranged at equal intervals on the first surface. A distance between the external terminals PIN1 and PIN2 adjacent to each other is denoted by "$d_A$." A distance between the external terminals PIN2 and PIN3 and a distance between the external terminals PIN3 and PIN4 are the same as the distance $d_A$. On the second surface, the external terminals PIN5 and PIN6 are adjacent to each other, and the external terminals PIN6 and PIN7 are adjacent to each other. A distance between the external terminals PIN5 and PIN6 is the same as the distance $d_A$, but a distance $d_B$ between the external terminals PIN6 and PIN7 is larger than the distance $d_A$.

The external terminal PIN7 is used as the external terminal TM1 to which the primary side voltage $V_P$ is applied (see also FIG. 1), the external terminal PIN3 is used as the external terminal TM2 connected to the ground GND1, the external terminal PIN1 is used as the external terminal TM3 from which the voltage information signal S1 is output, and the external terminal PIN4 is used as the external terminal TM4 to which the power supply voltage VCC1 is applied. The external terminals PIN2, PIN5, and PIN6 may be terminals that are not connected to any part of the semiconductor integrated circuit that forms the primary side IC 100. However, any one or more of the external terminals PIN2, PIN5, and PIN6 may have any one or more arbitrary functions.

For the sake of convenience, when an external terminal to which the primary side voltage $V_P$ is applied is referred to as a first external terminal and the other external terminals are referred to as second external terminals, the housing of the primary side IC 100 is provided with the first external terminal and the plurality of second external terminals (six second external terminals in the example of FIG. 14). In order to ensure insulation between the first external terminal to which a high voltage is applied and the second external terminals adjacent thereto, a sufficient creepage distance should be ensured between them.

Considering this, a first arrangement condition described below may be satisfied for the primary side IC 100. The first arrangement condition is that "a distance db between the first external terminal and a second external terminal adjacent to the first external terminal among the plurality of second external terminals is larger than a distance da between two adjacent second external terminals among the plurality of second external terminals." In the example of FIG. 14, the distances $d_A$ and $d_B$ correspond to the distances da and db, respectively. In FIG. 14, the number of external terminals is seven, but the number of external terminals provided in the primary side IC 100 is not limited thereto, and the first arrangement condition may be satisfied regardless of the number of external terminals. However, as long as a necessary creepage distance can be secured, the distance da and the distance db may be equal to each other (for example, in the example of FIG. 14, four external terminals may be arranged equally spaced apart from each other by the distance $d_A$ on the second surface).

Moreover, a second arrangement condition described below may be satisfied for the primary side IC 100. The second arrangement condition is that "the first external terminal is provided at the end of the housing of the primary side IC 100." That is, when an external terminal row constituted by the first external terminal and two or more second external terminals is arranged on a predetermined surface of the housing, the first external terminal may be placed in either one of both ends of the external terminal row. This makes it easy to secure a necessary creepage distance. In FIG. 14, the number of external terminals is seven. However, the number of external terminals provided in the primary side IC 100 is not limited thereto, and the second arrangement condition may be satisfied regardless of the number of external terminals. However, it is not essential to satisfy the second arrangement condition. For example, the external terminal PIN6 or PIN2 in FIG. 14 may function as the external terminal TM1 in FIG. 1.

Sixth Embodiment

A sixth embodiment of the present disclosure will be described. The sixth embodiment describes a modification technique, an application technique, and the like that can be applied to any one of the above-described first to fifth embodiments.

In the load driving device 1, the photo coupler PC is used as an insulation type signal transmission component for transmitting the signal S1 in the primary side circuit 10 to the secondary side circuit 20, as the signal S2 in an insulated form. However, instead of the photo coupler PC, a transformer may be used as the insulation type signal transmission component.

The load driving device 1 (load driving system) of FIG. 1 includes a load control system. The load control system includes the primary side IC 100 as a semiconductor device, and a load control circuit that drives and controls the load LD based on the voltage information of the primary side voltage $V_P$ transmitted from the primary side IC 100 via the insulation type signal transmission component. The load control circuit corresponds to the MPU 24 in the configuration of FIG. 1. The load control system may be considered to further include arbitrary components (for example, the transformer TR and the photo coupler PC) other than the primary side IC 100 and the MPU 24 among the components constituting the load driving device 1 of FIG. 1.

As described above, the PWM signal that has been pulse width-modulated according to the primary side voltage $V_P$ or the PFM signal that has been pulse frequency-modulated according to the primary side voltage $V_P$ is generated as the voltage information signal S1. However, the voltage information signal S1 may be a signal that is not classified as either the PWM signal or the PFM signal (for example, a signal that indicates voltage information by the number of pulses, or a signal that indicates voltage information in the form of a pulse train).

The voltage dividing resistor part 110 may be provided outside the primary side IC 100 and externally connected to the primary side IC 100.

A relationship between a high level and a low level of any signal or voltage may be reversed without impairing the above-described gist. In addition, the channel type of FET may be arbitrarily changed without impairing the above-described gist.

Each of the above-described transistors may be any type of transistor. For example, the transistor described above as a MOSFET may be replaced with a junction type FET, an IGBT (Insulated Gate Bipolar Transistor), or a bipolar transistor. Any transistor includes a first electrode, a second electrode, and a control electrode. In the FET, one of the first and second electrodes is a drain, the other is a source, and the control electrode is a gate. In the IGBT, one of the first and second electrodes is a collector, the other is an emitter, and the control electrode is a gate. In the bipolar transistor that does not belong to the IGBT, one of the first and second electrodes is a collector, the other is an emitter, and the control electrode is a base.

The embodiments of the present disclosure may be variously modified as appropriate within the scope of the technical idea defined in the claims. The above embodiments are merely examples of embodiments of the present disclosure, and meanings of the terms of the present disclosure or constituent elements thereof are not limited to those described in the above embodiments. The specific numerical values described in the above description are merely examples, and as a matter of course, they may be changed to other various numerical values.

According to the present disclosure in some embodiments, it is possible to provide a semiconductor device and a load control system that contribute to information transmission of a primary side voltage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device disposed on a primary side of a system which generates a secondary side voltage in an insulated form from a primary side voltage, the semiconductor device comprising:
   a signal generation circuit configured to generate a voltage information signal for transmitting voltage information based on the primary side voltage to a secondary side of the system in the insulated form,
   wherein the signal generation circuit is further configured to generate the voltage information signal based on an input voltage obtained by dividing the primary side voltage.

2. The semiconductor device of claim 1, wherein the signal generation circuit includes a plurality of comparators configured to compare the input voltage with a plurality of reference voltages, and
   wherein the signal generation circuit is further configured to generate the voltage information signal according to a result of the comparison of each of the comparators.

3. The semiconductor device of claim 1, wherein the signal generation circuit includes a current generation circuit configured to generate a current corresponding to the input voltage, and
   wherein the signal generation circuit is further configured to generate a signal corresponding to a magnitude of the current as the voltage information signal.

4. The semiconductor device of claim 1, further comprising a voltage dividing resistor configured to divide the primary side voltage to obtain the input voltage,
   wherein the voltage dividing resistor and the signal generation circuit are integrated on a single semiconductor substrate.

5. The semiconductor device of claim 4, wherein a high breakdown voltage region and other regions are formed on the semiconductor substrate,
   wherein a breakdown voltage in a substrate thickness direction is higher in the high breakdown voltage region than in the other regions, and
   wherein the voltage dividing resistor is formed in the high breakdown voltage region.

6. The semiconductor device of claim 5, wherein the high breakdown voltage region is an LDMOSFET region.

7. The semiconductor device of claim 6, wherein a plurality of drain regions each having a ring shape and a plurality of source regions each having a ring shape are alternately and concentrically formed in the LDMOSFET region, and
   wherein the voltage dividing resistor is formed on a field oxide film surrounded by an innermost peripheral drain region among the plurality of drain regions.

8. The semiconductor device of claim 4, further comprising a plurality of external terminals configured to protrude from a housing in which the semiconductor substrate is accommodated,
   wherein the plurality of external terminals include a first external terminal configured to receive the primary side voltage, and a plurality of second external terminals different from the first external terminal, and
   wherein a distance between the first external terminal and a second external terminal adjacent to the first external terminal among the plurality of second external terminals is larger than a distance between two second external terminals adjacent to each other among the plurality of second external terminals.

9. The semiconductor device of claim 4, further comprising a plurality of external terminals configured to protrude from a housing in which the semiconductor substrate is accommodated,
   wherein the plurality of external terminals include a first external terminal configured to receive the primary side voltage, and a plurality of second external terminals different from the first external terminal, and
   wherein the first external terminal is disposed at an end of the housing.

10. The semiconductor device of claim 1, wherein the signal generation circuit is further configured to generate a signal that is pulse width-modulated or a signal that is pulse frequency-modulated according to the primary side voltage, as the voltage information signal.

11. The semiconductor device of claim 1, wherein the voltage information is transmitted to the secondary side using a photo coupler or a transformer.

12. A load control system comprising:
   the semiconductor device of claim 1; and
   a load control circuit disposed on the secondary side, the load control circuit being configured to control a load to be driven based on the secondary side voltage,
   wherein the load control circuit is configured to control the load based on the voltage information transmitted from the semiconductor device.

* * * * *